United States Patent [19]

Sano

[11] Patent Number: 5,014,777
[45] Date of Patent: May 14, 1991

[54] COOLING STRUCTURE

[75] Inventor: Toshifumi Sano, Tokyo, Japan

[73] Assignee: NEC Corporation, Minato, Japan

[21] Appl. No.: 409,426

[22] Filed: Sep. 19, 1989

[30] Foreign Application Priority Data

Sep. 20, 1988 [JP] Japan .................. 63-237026
Dec. 21, 1988 [JP] Japan .................. 63-322333
Jan. 26, 1989 [JP] Japan .................. 1-19003

[51] Int. Cl.$^5$ .............................. F28F 7/00
[52] U.S. Cl. ................................ 165/185; 357/81; 361/386
[58] Field of Search ............... 165/80.2, 80.4, 185; 361/386; 357/81, 82

[56] References Cited

U.S. PATENT DOCUMENTS

| | | | |
|---|---|---|---|
| 2,357,706 | 9/1944 | Toepperwein | 156/80 |
| 2,783,418 | 2/1957 | Peter et al. | 317/234 |
| 2,999,034 | 9/1961 | Heidenhain | 117/5.5 |
| 3,205,469 | 9/1965 | Frank et al. | 339/18 |
| 3,211,969 | 10/1965 | Colaiaco | 317/234 |
| 3,651,865 | 3/1972 | Feldmanis | 165/80.4 |
| 3,694,182 | 9/1972 | Akfirat et al. | 165/185 X |
| 3,777,220 | 12/1973 | Tatusko et al. | 174/685 |
| 3,827,457 | 8/1974 | Vutz et al. | 137/599 |
| 3,881,181 | 4/1975 | Khajezadeh | 357/69 |
| 3,908,188 | 9/1975 | Kawamoto | 357/82 |
| 3,912,001 | 10/1975 | Missman et al. | 165/80.4 |
| 3,993,123 | 11/1976 | Chu et al. | 165/80.4 |
| 4,037,270 | 7/1977 | Ahmann et al. | 361/385 |
| 4,093,971 | 6/1978 | Chu et al. | 361/382 |
| 4,109,707 | 8/1978 | Wilson et al. | 165/46 |
| 4,110,549 | 8/1978 | Goetzke et al. | 174/16 HS |
| 4,115,836 | 9/1978 | Hutchison et al. | 361/382 |
| 4,151,547 | 4/1979 | Rhoades et al. | 357/81 |
| 4,158,875 | 6/1979 | Tajima et al. | 361/384 |
| 4,196,775 | 4/1980 | Groh | 165/68 |
| 4,204,246 | 5/1980 | Arii et al. | 165/105 |
| 4,245,273 | 1/1981 | Feinberg et al. | 361/382 |
| 4,282,924 | 8/1981 | Faretra | 165/80.4 |
| 4,381,032 | 4/1983 | Cutchaw | 165/46 |
| 4,398,208 | 8/1983 | Murano et al. | 357/81 |

(List continued on next page.)

FOREIGN PATENT DOCUMENTS

| | | | |
|---|---|---|---|
| 55-86130 | 6/1980 | Japan | 29/840 |
| 56-70655 | 6/1981 | Japan . | |
| 57-106062 | 7/1982 | Japan | 361/414 |
| 57-211761 | 12/1982 | Japan | 357/81 |
| 58-114445 | 7/1983 | Japan | 357/82 |
| 59-130450 | 7/1984 | Japan . | |
| 59-155156 | 9/1984 | Japan | 357/81 |
| 60-145647 | 8/1985 | Japan | 357/81 |
| 60-160150 | 8/1985 | Japan . | |
| 60-257156 | 12/1985 | Japan | 357/81 |
| 61-171157 | 8/1986 | Japan . | |
| 61-226946 | 10/1986 | Japan . | |
| 61-276242 | 12/1986 | Japan . | |
| 62-281456 | 12/1987 | Japan | 357/82 |
| 63-81959 | 4/1988 | Japan . | |
| 63-226049 | 9/1988 | Japan . | |
| 63-308943 | 12/1988 | Japan . | |
| 572951 | 9/1977 | U.S.S.R. . | |

OTHER PUBLICATIONS

IEEE International Conference on Computer Design: VLSI In Computers ICCD '83 Session, The New IBM 4381, "New Internal and External Cooling Enhancements for the Air-Cooled IBM 4381 Module", Oktay et al., 4 pages (Nov. 1, 1983).

Primary Examiner—Martin P. Schwadron
Assistant Examiner—Allen J. Flanigan
Attorney, Agent, or Firm—Burns, Doane, Swecker & Mathis

[57] ABSTRACT

A cooling structure which includes a substrate, at least one heat generating member fixed on the substrate, a heat radiating member provided above the heat generating member, and an elastic heat transfer sheet provided between the heat generating member and the heat radiating member for conducting heat generated in the heat generating member to the heat radiating member, with either the heat radiating member being formed with grooves at least on the part opposite the heat generating member, or the at least one heat generating member being formed with grooves on the upper portion thereof, or the elastic heat transfer sheet being formed with grooves on either one of the surface opposite the heat generating member or the surface opposite the heat radiating member.

20 Claims, 6 Drawing Sheets

U.S. PATENT DOCUMENTS

| | | | |
|---|---|---|---|
| 4,439,918 | 4/1984 | Carroll et al. | 29/840 |
| 4,467,522 | 8/1984 | Marchisi | 29/827 |
| 4,468,717 | 8/1984 | Mathias et al. | 361/382 |
| 4,493,010 | 1/1985 | Morrison et al. | 361/385 |
| 4,498,122 | 2/1985 | Rainal | 361/414 |
| 4,509,096 | 4/1985 | Baldwin et al. | 361/386 |
| 4,535,385 | 8/1985 | August et al. | 361/388 |
| 4,536,824 | 8/1985 | Barrett et al. | 361/384 |
| 4,546,410 | 10/1985 | Kaufman | 361/387 |
| 4,574,879 | 3/1986 | DeGree et al. | 165/185 |
| 4,588,023 | 5/1986 | Munekawa | 165/104.33 |
| 4,602,125 | 7/1986 | West et al. | 174/138 G |
| 4,602,678 | 7/1986 | Fick | 165/79 |
| 4,628,990 | 12/1986 | Hagihara et al. | 165/80.4 |
| 4,638,404 | 1/1987 | Grossmann et al. | 361/388 |
| 4,641,176 | 2/1987 | Keryhuel et al. | 357/74 |
| 4,644,385 | 2/1987 | Nakanishi et al. | 357/82 |
| 4,654,754 | 3/1987 | Daszkowski | 361/388 |
| 4,666,545 | 5/1987 | DeGree et al. | 156/252 |
| 4,685,211 | 8/1987 | Hagihara et al. | 29/832 |
| 4,686,606 | 8/1987 | Yamada et al. | 361/385 |
| 4,689,659 | 8/1987 | Watanabe | 357/81 |
| 4,712,158 | 12/1987 | Kikuchi et al. | 361/385 |
| 4,721,996 | 1/1988 | Tustaniwskyj et al. | 357/82 |
| 4,724,611 | 2/1988 | Hagihara | 29/840 |
| 4,727,554 | 2/1988 | Watanabe | 372/36 |
| 4,729,424 | 3/1988 | Mizuno et al. | 165/30 |
| 4,744,007 | 5/1988 | Watari et al. | 361/386 |
| 4,748,495 | 5/1988 | Kucharek | 357/82 |
| 4,750,086 | 6/1988 | Mittal | 361/382 |
| 4,768,352 | 9/1988 | Maruyama | 62/383 |
| 4,781,244 | 11/1988 | Kuramitsu et al. | 165/80.4 |
| 4,783,721 | 11/1988 | Yamamoto et al. | 361/382 |
| 4,791,983 | 12/1988 | Nicol et al. | 165/80.4 |
| 4,794,981 | 1/1989 | Mizuno | 165/80.4 |
| 4,838,347 | 6/1989 | Dentini et al. | 165/185 |
| 4,884,167 | 11/1989 | Mine | 361/382 |

OTHER PUBLICATIONS

IEEE International Conference on Computer Design: VLSI In Computer ICCD '83 Session, The New IBM 4381, "Electrical Design and Analysis of the Air--Cooled Module (ACM) in IBM System/4381", Cherensky et al., 6 pages (Nov. 1, 1983).

IEEE International Conference on Computer Design: VLSI in Computers ICCD '83 Session, The New IBM 4381, "Hermetic Tin/Lead Solder Sealing for the Air--Cooled IBM 4381 Module", Brady et al., 4 pages (Nov. 1, 1983).

Microelectronics, Scientific American, Published 1977 by W. H. Freeman and Company, San Francisco, Cover page, pp. 51, 166.

Assembly Techniques, pp. 404-420, understood to be from the book Integrated Circuit Engineering, publishing data not known.

IEEE Transactions On Components, Hybrids and Manufacturing Technology, vol. CHMT-2, No. 3, Sep. 1979, "Bumped Tape Automated Bonding (BTAB) Practical Application Guidelines", Kanz et al., pp. 301-308.

IEEE Transactions on Components, Hybrids, and Manufacturing Tech., vol. CHMT-3, No. 1, Mar. 1980, "IBM Multichip Multilayer Ceramic Modules for LSI Chips-Design for Performance and Density", Clark, et al., pp. 89-93.

IBM J. Res. Develop., vol. 26, No. 1, pp. 55-66 (Jan. 1982), "A Conduction-Cooled Module for High-Performance LSI Devices", Oktay, et al.

Electronics, "Supercomputers Demand Innovation in Packaging and Cooling", Lyman, pp. 136-144, Sep. 22, 1982.

IBM Technical Disclosure Bulletin, "Counter-Flow Cooling System", Chu, vol. 8, No. 11, Apr. 1966, p. 1692.

IBM Technical Disclosure Bulletin, vol. 18, No. 12, pp. 3982-3983, "Heat-Pipe Cooled Stacked Electronic Wafer Package", Kerjilian et al., May 1976.

IBM Technical Disclosure Bulletin, vol. 20, No. 4, Sep. 1977, "Method of Effective Cooling of a High Power Silicon Chip", Doo et al, pp. 1436-1437.

IBM Technical Disclosure Bulletin, vol. 20, No. 11A, Apr. 1978, "Three-Dimensional MLC Substrate Integrated Circuit Support Package", Aichelmann et al., pp. 4349 and 4350.

IBM Technical Disclosure Bulletin, vol. 20, No. 11A, Apr. 1978, "Conduction-Cooling Module", Hwang et al., pp. 4334-4335.

IBM Technical Disclosure Bulletin, vol. 21, No. 6, (Nov. 1978), "Compliant Cold Plate Cooling Scheme", Antonetti et al., p. 2431.

IBM Technical Disclosure Bulletin, vol. 21, No. 6, Nov. 1978, "Solid Encapsulated Module", Chu et al., pp. 2435-2436.

Forward and Introduction of IEEE International Conference on Computer Design, VLSI in Computers, ICCD '83 Session, The New IBM 4381, 3 pages (Nov. 1, 1983).

"Module Package" by Dion et al., IBM Technical Disclosure Bulletin, vol. 7, No. 7, one page, Dec. 1964.

COOLING STRUCTURE

BACKGROUND OF THE INVENTION

The invention relates to a cooling structure.

An example of prior art cooling structures for cooling electronic components is disclosed in U.S. Pat. No. 4,685,211. In the structure disclosed, a silicone rubber sheet 32 is inserted between a piston 15 and chips 11 to absorb the gap if the chips 11 are mounted on a substrate 12 with an inclination. In order to absorb such gap, the thickness of the silicone rubber sheet 32 should be increased, which increases thermal resistance, and this results in deteriorated heat radiation efficiency.

An object of the invention is, therefore, to provide a cooling structure free from the above-mentioned disadvantage.

SUMMARY OF THE INVENTION

According to an aspect of the invention, there is provided a structure which comprises: a substrate; at least one heat generating member fixed on said substrate; a heat radiation member provided above said heat generating member which is provided with grooves at least on the surface opposite said heat generating member; and an elastic heat transfer sheet which is provided between said heat generating member and said heat radiating member for conducting heat from said heat generating member to said heat radiating member.

According to another aspect of the invention, there is provided a structure which comprises: a substrate; at least one heat generating member fixed on said substrate which is provided with grooves at the top; a heat radiating member provided above said heat generating member and an elastic heat transfer sheet which is provided between said heat generating member and said heat radiating member for conducting the heat generated from said heat generating member to said heat radiating member.

According to still another aspect of invention, there is provided a structure which comprises: a substrate; at least one heat generating member fixed on said substrate; a heat radiating member provided above said heat generating member; and an elastic heat transmitting sheet which is provided between said heat generating member and said heat radiating member for conducting the heat generated from said heat generating member to said heat radiating member, which is formed with grooves at least on either one of the surface opposing said heat generating member and the surface opposing said heat radiating member.

BRIEF DESCRIPTION OF THE DRAWINGS

Other features and advantages will become more apparent from the following description when taken in conjunction with the drawings.

In the drawings, the same reference numerals represent the same structural elements.

DETAILED DESCRIPTION OF THE PREFERRED EMBODIMENTS OF THE INVENTION

Figure 1:
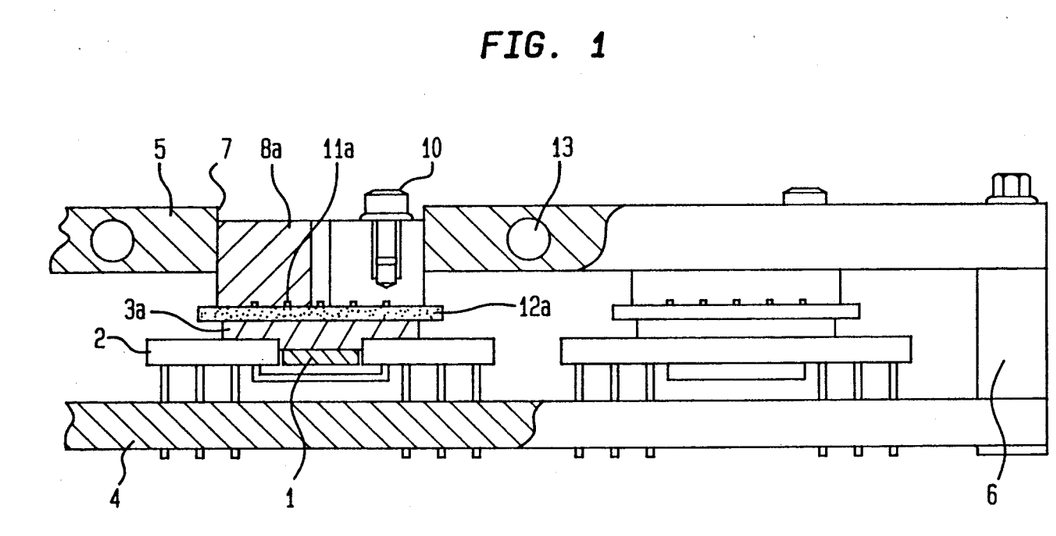
FIG. 1 is a cross-sectional view of a first embodiment of the invention.

Referring now to FIG. 1, a first embodiment of the invention comprises a plurality of semiconductor components 1 and a heat transfer plate 3a of an LSI case 2 attached on the components 1. The plate 3a may be made of a material which has a thermal expansion coefficient almost identical to that of the semiconductor components 1 and has a high thermal conductivity such as a Cu/W alloy. The case 2 is mounted on a printed wiring substrate 4 so as to have the plate 3a facing the direction opposite to the substrate 4. A cold plate 5 is fixed on the substrate 4 to oppose the substrate 4 via a spacer 6. A cylinder hole 7 is bored through the cold plate 5 at a position corresponding to the case 2, and a piston 8a is inserted through the cylinder hole 7.

Figure 3A:
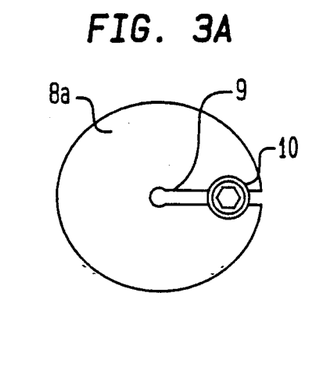
FIGS. 3A and 3B are a top view and a bottom view of a piston used in the first embodiment, respectively.
Figure 3B:
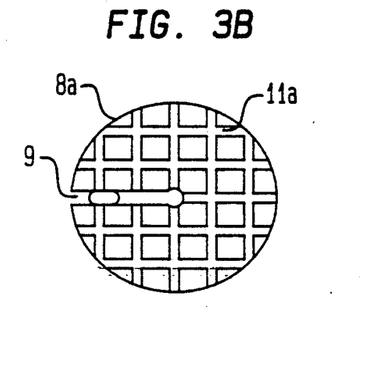
Figure 4A:
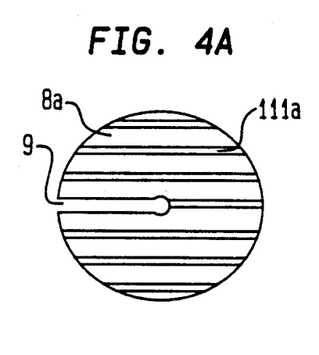
FIGS. 4A through 4D show plan views for showing different grooves formed on the piston.
Figure 4B:
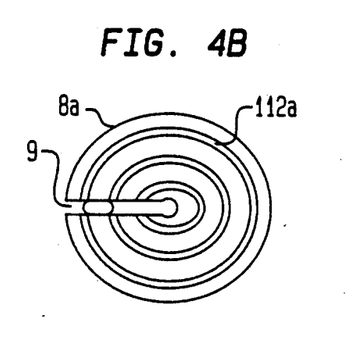
Figure 4C:
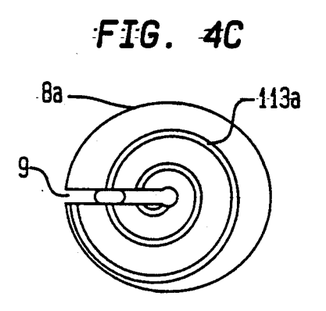
Figure 4D:
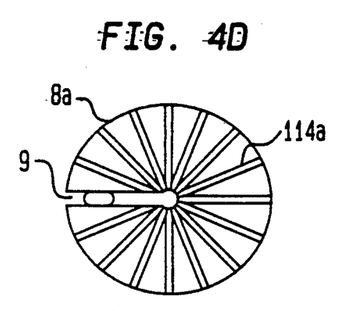

As shown in FIG. 3A, the piston 8a is slit to have a slot 9, and the piston 8a can be snugly attached on the side thereof onto the wall surface defining the hole 7 by tightening a screw 10 inserted in the slit 9. Grooves 11a are formed on the surface of the piston 8a opposing the case 2 as shown in FIG. 3B. A heat transfer sheet 12a is placed between the piston 8a and the plate 3a, and when the piston 8a is fixed with a force applied on the side of the case 2, the sheet 12a is held in elastic deformation between the piston 8a and the plate 3a.

The heat generated from the components 1 is transferred to the plate 3a, the heat transfer rubber sheet 12a, and the piston 8a, and then removed by coolant 13 circulating in the plate 5 via the hole 7 to thereby cool the components 1.

In this embodiment, it is necessary to reduce the thickness of the sheet 12a which has a lower heat transfer coefficient than other heat conductive members and to improve the contact between the piston 8a, the plate 3a and the sheet 12a in order to lower the thermal resistance. However, this embodiment is structured to absorb the inclination of the plate 3a with respect to the opposing surface of the piston 8a caused by fluctuation in assembly and dimension of parts with the deformation of the sheet 12a to increase the contact area. The sheet 12a needs to have a certain degree of thickness in order to absorb the inclination on the plate 3a with the deformation thereof. If the deformation of the sheet 12a can be increased irrespective of the thickness, then the thickness thereof can be reduced.

Figure 2A:
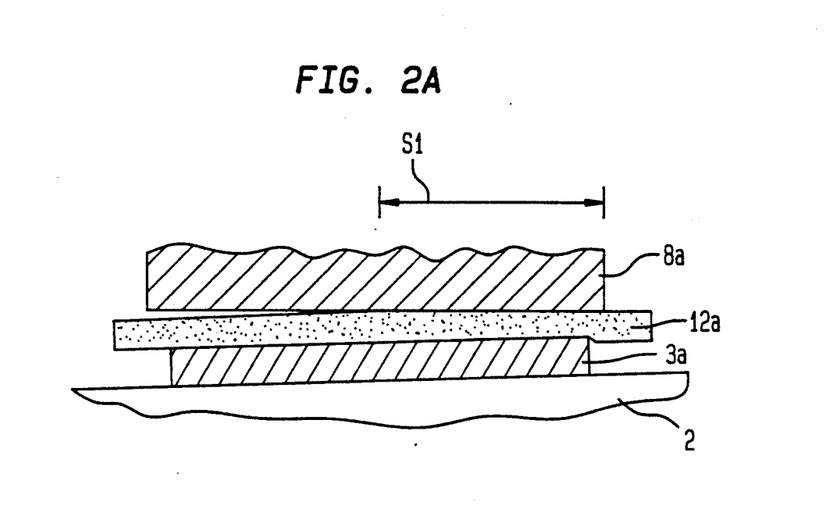
FIGS. 2A and 2B are cross-sectional views for explaining the effect of a heat transfer rubber sheet used in the first embodiment.
Figure 2B:
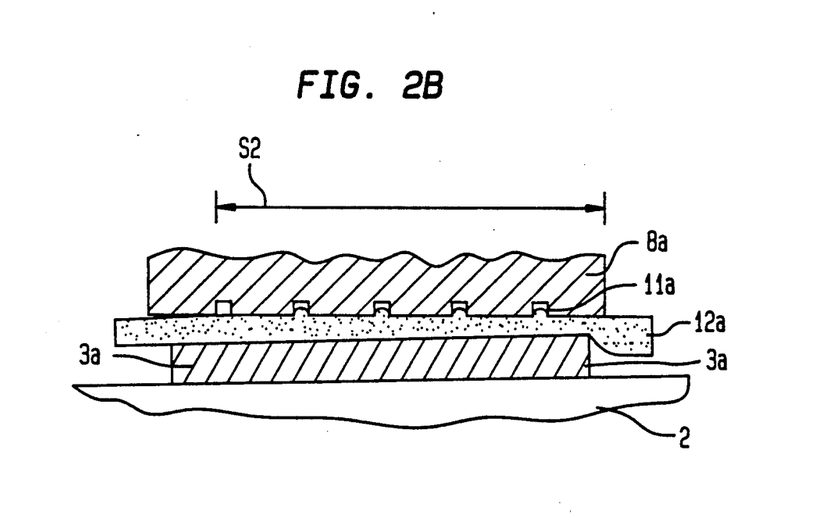

FIGS. 2A and 2B show the difference in contact between the piston 8a, the plate 3a and the sheet 12a depending on absence/presence of the grooves 11a. If there are no grooves 11a formed on the piston 8a, it evenly presses a thin rubber sheet 12a in a wider area, and little deformation occurs laterally. Since there is little deformation in the lateral direction, the deformation of the sheet 12a is small, and as shown by the contact area S1 in FIG. 2a, the contact area becomes small. If the piston 8a is formed with grooves 11a, on the other hand, when the heat transfer rubber sheet 12a is pressed, the sheet 12a becomes deformed to rise inside the grooves 11a to thereby increase the deformation of the sheet 12a, and as shown in S2, the contact area increases.

Simply by forming the grooves 11a at the end of the piston 8a, a wider contacting area can be secured between the piston 8a, the plate 3a and the sheet 12a. It also reduces the thermal resistance thereof because the thickness of the heat transfer rubber sheet 12a can be reduced.

So far as the grooves 11a of the piston 8a are provided evenly on the surface corresponding to the LSI case, the shape thereof is not necessarily limited to the form of grooves as shown in FIG. 3B. A similar effect can be attained by providing the grooves in parallel lines 111a, a concentric form 112a, a spiral form 113a, a radial form 114a or a combination of any of them. Cross section of the grooves is not limited to a rectangle, but may be a triangle or semicircular. So far as it can absorb the deformation caused on the surface of the piston 8a, the grooves do not necessarily have to be provided, but the trace of cuts made by a milling cutter when machining the piston 8a may be left unfinished thus making the surface thereof roughened. The same effect can be achieved by roughening the surface of the piston 8a by sandblasting, rollers, or press working.

Figure 5:
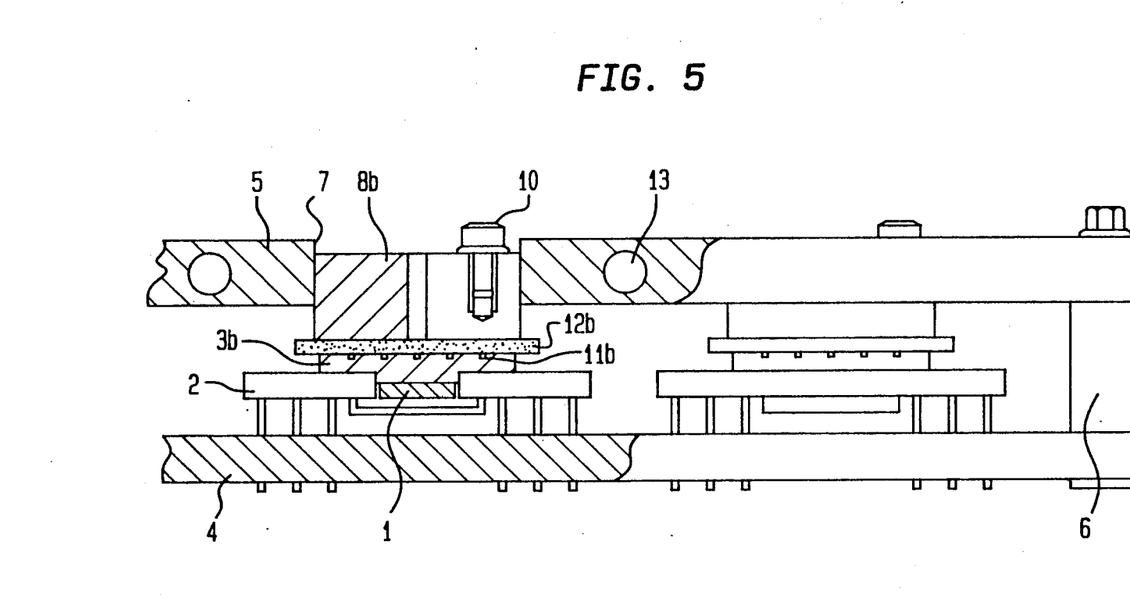
FIG. 5 is a cross-sectional view of a second embodiment of the invention.
Figure 6:
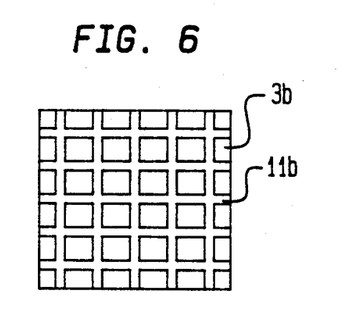
FIG. 6 is a plane view for showing a heat transfer plate used in the second embodiment.
Figure 7A:
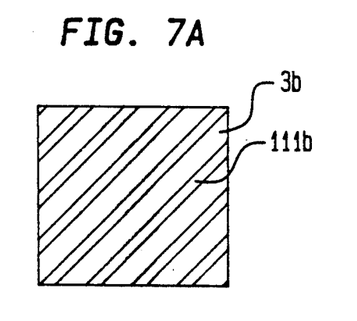
FIGS. 7A through 7D are plan views for showing different grooves formed on the heat transfer plate.
Figure 7B:
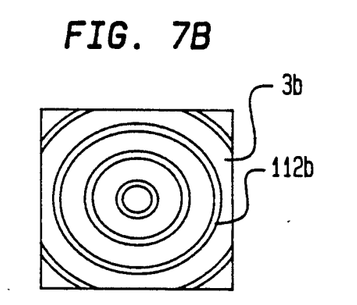
Figure 7C:
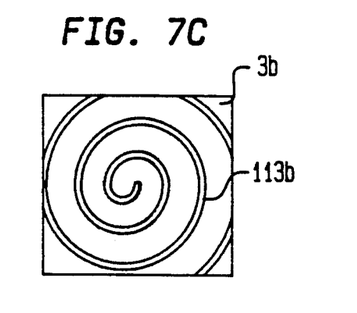
Figure 7D:
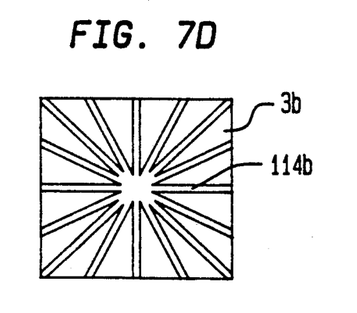

Referring now to FIG. 5, a second embodiment of the invention comprises a plurality of semiconductor components 1 and a heat transfer plate 3b of an LSI case 2 mounted on the components 1. The plate 3b has a thermal expansion coefficient nearly identical to that of the semiconductor components 1 and is made of a material having a high heat conductivity, such as Cu/W alloy. Grooves 11b are formed on the surface of the plate 3b opposite the side where it is attached to the semiconductor components 1 in the form of a grid as shown in FIG. 6, to thereby roughen the surface.

The case 2 is mounted on a printed substrate 4. The plate 3b is attached on the side opposite the substrate 4 of the case 2. A cold plate 5 is provided to oppose the substrate 4 and is fixed on the substrate 4 via a spacer 6. The cold plate 5 is bored with a cylinder hole 7 at a position corresponding to the LSI case while a piston 8b is inserted inside the cylinder hole 7.

So far as the grooves 11b are provided evenly on the surface of the plate 3b opposing the piston 8b, it does not necessarily have to take the form of grooves. They may take the form of parallel grooves 111b, concentric grooves 112b, spiral grooves 113b, radial grooves, or a combination of any of them as shown in FIGS. 7A through 7D to achieve the same effect. The cross section of the grooves is not limited to a rectangle, but may be a triangle or a semicircle.

So far as the deformation of the sheet 12 can be effectively prevented with the roughened surface of the plate 3b, it is not always necessary to provide grooves. The same effect may be achieved by roughening the surface of the piston by leaving the cut traces made by a milling cutter while machining the plate 3b with sandblasting, rolling or press machining.

Figure 8:
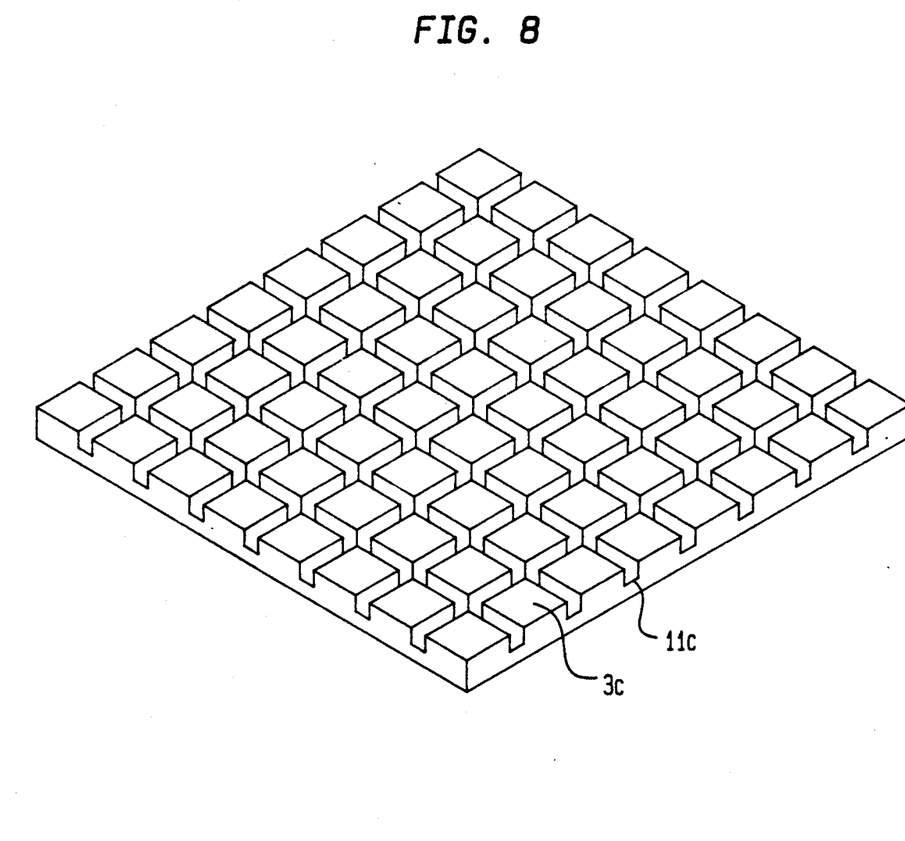
FIG. 8 shows a perspective view of a heat transfer sheet provided with grooves.

Grooves 11a and 11b are formed respectively on the piston 8a and the plate 3b in the first and second embodiments, but they may be replaced with grooves 11c on the sheet 3c as shown in FIG. 8. The heat transfer sheet 3c is made of a material prepared by mixing silicone polymer as a matrix and heat conductive metal oxides.

What is claimed is:
1. A cooling structure comprising:
a substrate;
at least one heat generating member fixed on said substrate;
a heat radiating member provided above said heat generating member which is formed with grooves at least on the part opposite said heat generating member; and
an elastic heat transfer sheet provided between said heat generating member and said heat radiating member for conducting heat generating in said heat generating member to said heat radiating member.
2. A cooling structure comprising:
a substrate;
at least one heat generating member fixed on said substrate which is formed with grooves on upper portion thereof;
a heat radiating member provided above said heat generating member; and
an elastic heat transfer sheet provided between said heat generating member and said heat radiating member for conducting heat generating in said heat generating member to said heat radiating member.
3. The cooling structure as set forth in claim 1, wherein said heat radiating member is a piston on which said grooves are formed.
4. The cooling structure as set forth in claim 1, wherein said grooves are arranged in parallel linear relation.
5. The cooling structure as set forth in claim 1, wherein said grooves are arranged in a grid form.
6. The cooling structure as set forth in claim 1, wherein said grooves are arranged in a radial form.
7. The cooling structure as set forth in claim 1, wherein said grooves are arranged in a spiral form.
8. The cooling structure as set forth in claim 1, wherein said grooves are arranged in a concentric form.
9. The cooling structure as set forth in claim 1, wherein said at least one heat generating member includes at least one semiconductor component and includes a heat transfer plate, said heat transfer plate being made of a material having a high thermal conductivity and having a thermal expansion coefficient substantially equal to that of said at least one semiconductor component.
10. The cooling structure as set forth in claim 9, wherein said heat transfer plate is formed of a Cu/W alloy.
11. The cooling structure as set forth in claim 2, wherein said at least one heat generating member includes a heat transfer plate on which said grooves are formed and at least one semiconductor component, said heat transfer plate having a thermal expansion coefficient substantially equal to that of said at least one semiconductor component.
12. The cooling structure as set forth in claim 2, wherein said at least one heat generating member includes a heat transfer plate on which said grooves are formed, said heat transfer plate being made of a material having a high heat conductivity.
13. The cooling structure as set forth in claim 12, wherein said at least one heat generating member includes at least one semiconductor component, said heat transfer plate having a thermal expansion coefficient substantially equal to that of said at least one semiconductor component.
14. The cooling structure as set forth in claim 12, wherein said heat transfer plate is formed of a Cu/W alloy.

15. The cooling structure as set forth in claim 13, wherein said heat transfer plate is formed of a Cu/W alloy.

16. The cooling structure as set forth in claim 2, wherein said grooves are arranged in parallel linear relation.

17. The cooling structure as set forth in claim 2, wherein said grooves are arranged in a grid form.

18. The cooling structure as set forth in claim 2, wherein said grooves are arranged in a concentric form.

19. The cooling structure as set forth in claim 2, wherein said grooves are arranged in a radial form.

20. The cooling structure as set forth in claim 2, wherein said grooves are arranged in a spiral form.

* * * * *